United States Patent [19]

Morita et al.

[11] Patent Number: 4,525,629

[45] Date of Patent: Jun. 25, 1985

[54] DEFLECTIVE FOCUSING SYSTEM FOR CHARGED PARTICLE BEAM

[75] Inventors: Hirofumi Morita, Kiyose; Teruo Hosokawa, Tokorozawa, both of Japan

[73] Assignee: Nippon Telegraph & Telephone Public Corporation, Tokyo, Japan

[21] Appl. No.: 386,115

[22] Filed: Jun. 7, 1982

[30] Foreign Application Priority Data

Jun. 15, 1981 [JP] Japan ................................ 56-90901

[51] Int. Cl.³ ............................ G21K 1/08; H01J 3/14
[52] U.S. Cl. .......................... 250/396 ML; 250/396 R
[58] Field of Search ........... 250/396 R, 396 ML, 398, 250/492.2; 313/359.1; 335/210

[56] References Cited

U.S. PATENT DOCUMENTS

| | | | |
|---|---|---|---|
| 2,976,457 | 3/1961 | Reisner | 250/356 ML |
| 4,019,989 | 4/1977 | Hazewindus et al. | 250/396 R |
| 4,110,622 | 8/1978 | Trotel | 250/356 ML |
| 4,376,249 | 3/1983 | Pfeiffer et al. | 250/396 ML |

OTHER PUBLICATIONS

"Electron Optics of an Electron-Beam Lithographic System", Mauer et al, *IBM J. Res. Develope.*, Nov. 1977, pp. 514–521.

*Primary Examiner*—Bruce C. Anderson
*Attorney, Agent, or Firm*—Spencer & Frank

[57] ABSTRACT

A deflective focusing system includes a magnetic lens for focusing a charged particle beam, a plurality of rings made of magnetic material arranged substantially concentrically with the magnetic lens inside of the magnetic lens, the rings being arranged at spaced apart positions in the direction of the central axis of the magnetic lens so as to form a predetermined magnetic focusing field distribution, a one-stage electrostatic deflector having a plurality of deflection electrodes which are spaced apart in a circumferential direction of the magnetic lens, which are arranged substantially concentrically with the magnetic lens inside of the magnetic lens, and which extend in the direction of the central axis so as to form a predetermined electrostatic deflection field distribution, so that the charged particle beam passes through the concentrically arranged deflection electrodes to be deflected in accordance with a voltage applied to the deflection electrodes, and ring-like grounding electrodes disposed substantially concentrically with the magnetic lens on the object plane side and the image plane side of the electrostatic deflector along the passage of the charged particle beam. The electromagnetic field is adjusted by the deflector, the rings and the grounding electrodes to obtain small aberrations and a small landing angle.

16 Claims, 27 Drawing Figures

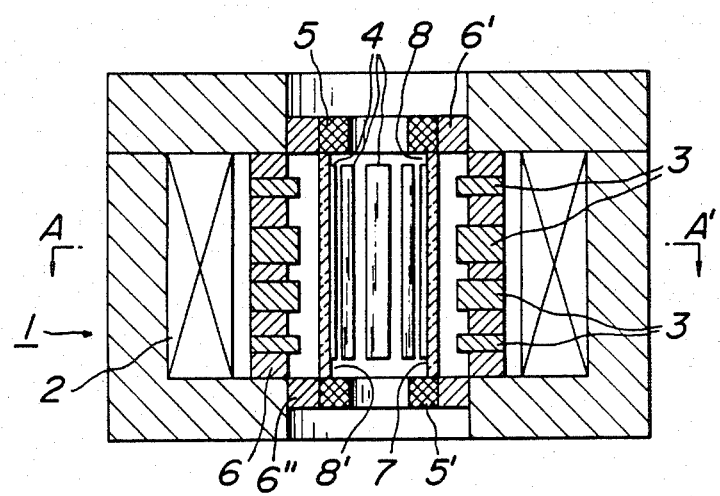
FIG_1A
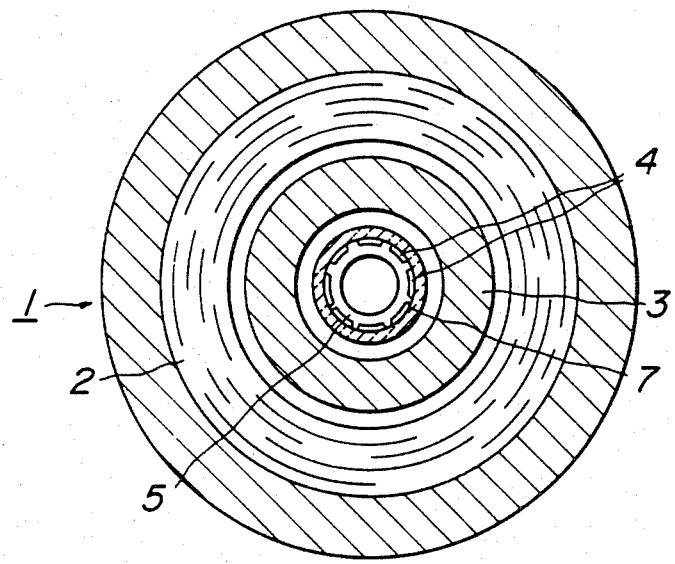
FIG_1B

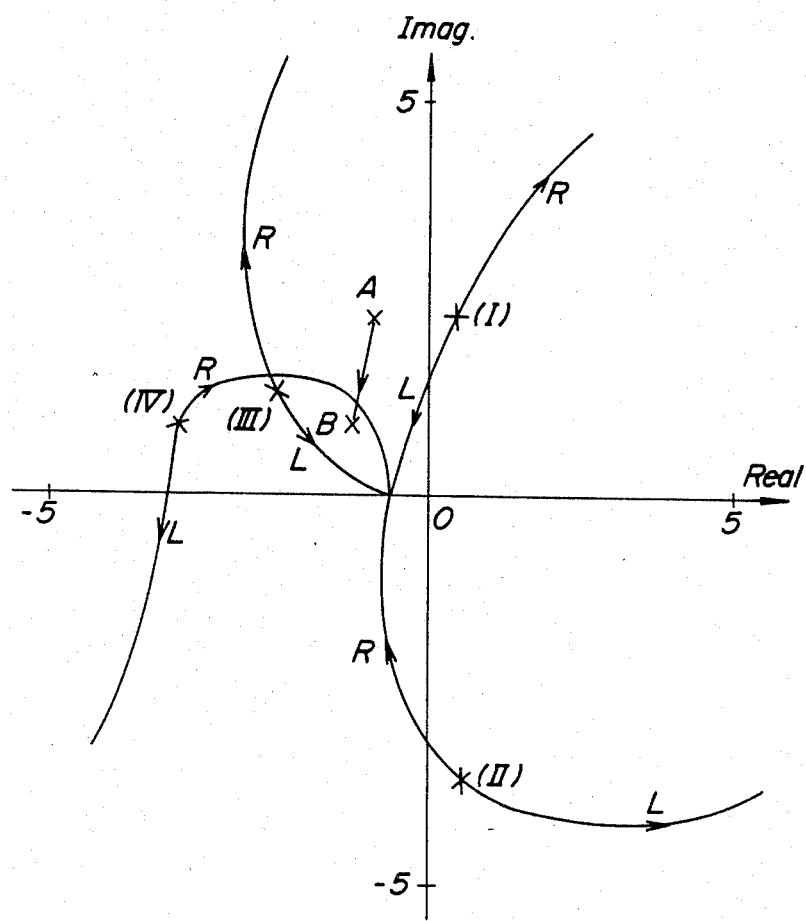
FIG_4

FIG_10

FIG_12

FIG_13

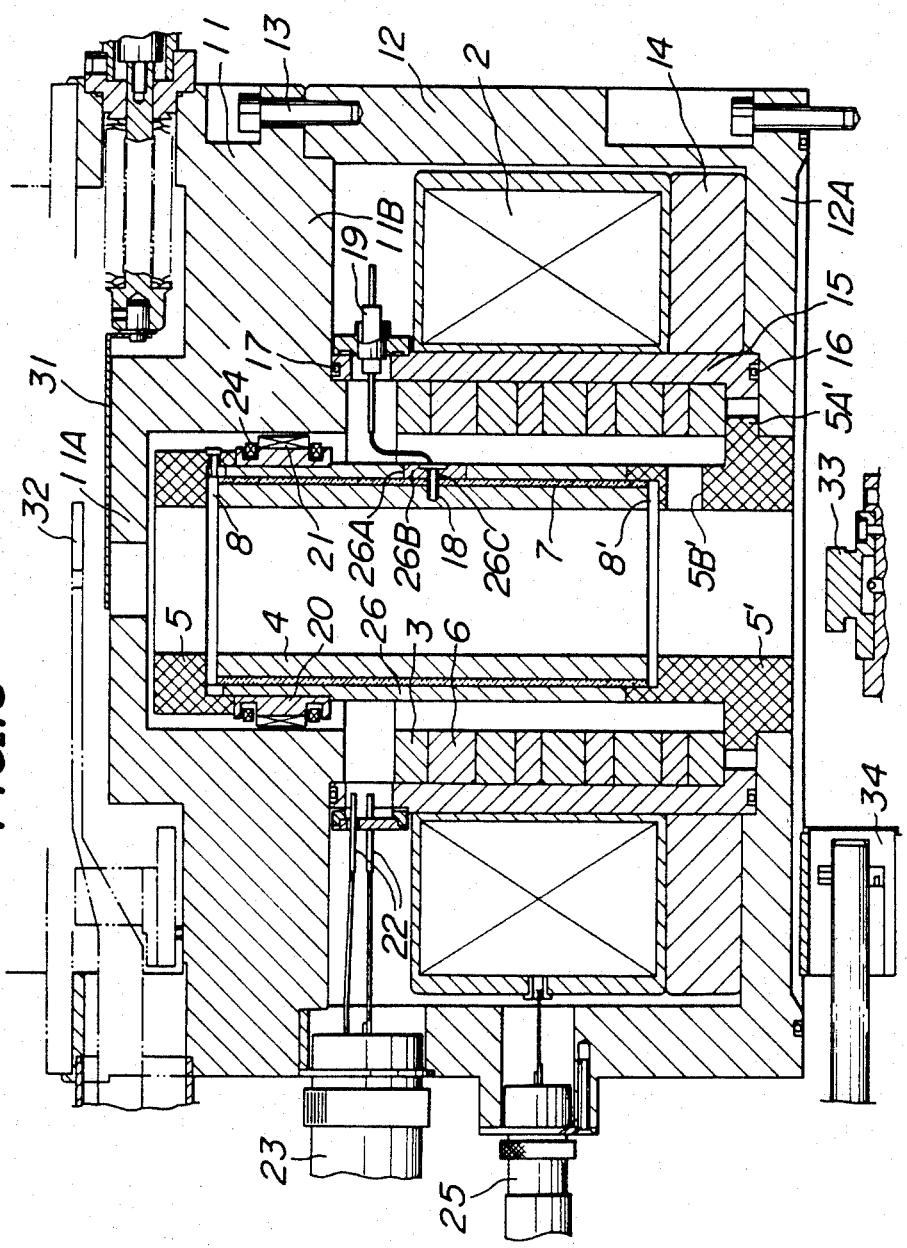

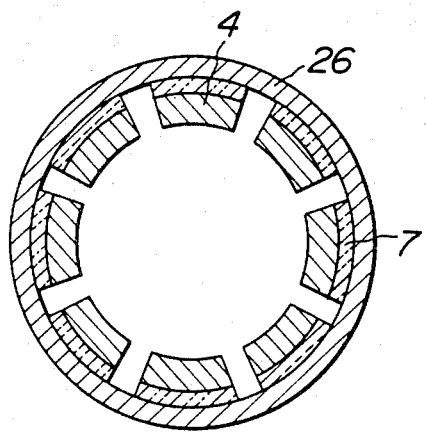
FIG_19

DEFLECTIVE FOCUSING SYSTEM FOR CHARGED PARTICLE BEAM

BACKGROUND OF THE INVENTION

The present invention relates to a deflective focusing system for a charged particle beam, the system having a magnetic lens and an electrostatic deflector.

In general, deflective focusing systems for charged particle beams (referred to merely as "beams", hereinafter) are widely used in cathode ray tubes, television camera tubes, electron beam processing equipment, electron beam exposure equipment, scanning type electron microscopes, or the like.

For example, as VLSI (Very Large Scale Integrated Circuit) techniques evolve, the development of an electron beam exposure equipment with high speed and high accuracy is strongly desired. In order to realize such an exposure equipment, it is essentially necessary to develop a high-performance deflective focusing system. In an electron beam exposure equipment, a beam produced from an electron gun is shaped to a beam with a square section. This square beam is then demagnified. The demagnified beam is then focused and deflected to project at a desired postion on a target plane or specimen wafer on a table. In the deflective focusing system, aberrations due to the deflection of the beam, i.e., chromatic aberration, astigmatism coma, field curvature and distortion, are required to be small and the landing angle at which a beam is incident to the target must also be small. If the aberrations and the landing angle are large, resolution and accuracy of patterning are lowered. Further, from a viewpoint of the high speed deflection of beam, electrostatic deflection is preferable to magnetic deflection.

Generally speaking, when a beam is focused and deflected by a magnetic focusing field and an electrostatic deflection field which overlap each other and these fields are distribute uniformly over the whole of the deflective focusing space, the aberrations are extremely low and the landing angle is small enough that the beam is incident vertically to an image plane or target.

In the electron beam exposure equipment, however, a demagnifying lens is disposed on the object plane side of the deflective focusing system and a wafer or stage is disposed on the image plane side, so that it is difficult to obtain a completely uniform electromagnetic field over the whole deflective focusing space. There are fringes on the object plane side and the image plane side of the deflective focusing system where the electric field and magnetic field abruptly change. If the electromagnetic field has fringes in this way, electron optical properties of the deflective focusing system are different from the properties in case of the uniform distribution. It follows that both of the aberrations and landing angle increase.

For instance, an in-lens type magnetic deflector is disclosed by J. L. Mauer et al. in "Electron Optics of an Electron-Beam Lithographic System", IBM J. RES. DEVELOP., pp. 514-521, November 1977. This deflector has large aberrations and landing angle and, since magnetic deflection is employed in this deflector, the deflection speed is slow.

There have also been some proposals where a plurality of stages of deflectors are provided and adjusted in a manner so that the deflective aberrations due to the respective deflectors cancel each other out to realize small aberrations and small landing angle throughout the system as a whole. See, for example, "Advanced deflection concept for large area, high resolution e-beam lithography" by H. C. Pfeiffer et al., J. Vac. Sci. Technol., 19(4), November/December 1981, pp. 1058-1063. In the disclosed variable axis lens, four-stage deflectors and one dynamic stigmator are used to reduce the deflective aberrations and landing angle. The deflective aberrations are completely removed and the vertical landing condition is also satisfied by such a multi-stage deflection system. These facts are theoretically proved by T. Hosokawa in "Systematic elimination of third order aberrations in electron beam scanning system", Optik, Vol. 56, No. 1 (1980), pp. 31-30.

In this case, however, the number of power sources for driving deflectors is increased because of the multi-stage deflectors. Since a power source of such a deflective focusing system is very expensive, the cost of this multi-stage deflection system is very complicated. In addition, high manufacturing techniques are required, as the number of deflection stages is increased. This requirement also constitutes a barrier against the realization of a multi-stage deflection system.

SUMMARY OF THE INVENTION

In view of the above, it is an object of the present invention to provide a deflective focusing system for a charged particle beam the system having a simple arrangement which attains the reduction of the aberrations and landing angle.

It is another object of the present invention to provide a deflective focusing system for a charged particle beam in which a uniform electromagnetic field without fringes is not employed; instead fringes produced in the electromagnetic field distribution of the deflective focusing system are utilized and the fringes are adjusted in such a way that an electromagnetic field distribution having small aberrations and landing angle, as in the case of a uniform electromagnetic field without fringes is obtained with a simple construction.

It is a further object of the present invention to provide a deflective focusing system for a charged particle beam in which parameters of the deflective focusing system are so selected that a magnetic focusing field and an electrostatic deflection field have substatially uniform distributions in a central portion of a magnetic lens, so as to obviate the above-described disadvantages.

In order to achieve these objects, a deflective focusing system according to the present invention comprises a magnetic lens for focusing a charged particle beam, a plurality of rings made of magnetic material arranged substantially concentrically with the magnetic lens inside of the magnetic lens, the rings being arranged dividedly (that is, at spaced apart positions) in the direction of the central axis of the magnetic lens so as to form a predetermined magnetic focusing field distribution, and a one-stage electrostatic deflector having a plurality of deflection electrodes which are spaced apart in a circumferential direction of the magnetic lens, the electrodes being arranged substantially concentrically with the magnetic lens inside of the magnetic lens and extending in the direction of the central axis so as to form a predetermined electrostatic deflection field distribution, so that the charged particle beam passes through the concentrically arranged deflection electrodes to be deflected in accordance with a voltage applied to the deflection electrodes.

In a preferable embodiment of the present invention, ring-like grounding electrodes are disposed substantially concentrically with the magnetic lens on the object plane side and the image plane side of the electrostatic deflector along the passage of the charged particle beam.

It is preferable to insert ring-like spacers between the rings of magnetic material, the spacers being made of non-magnetic material and having substantially the same diameter as the rings of magnetic material so that the magnetic focusing field distribution is adjusted by the thicknesses of the rings in the direction of the central axis and the thicknesses of the ring-like spacers.

It is also preferable to provide a gap for adjusting the electrostatic deflection field between the ring-like grounding electrodes and the electrostatic deflector, so that the electrostatic deflection field distribution is adjusted in accordance with the length of the gap. For example, the electrostatic deflection field has an abrupt fringe if the gap is narrow. Further, in order to have an abrupt fringe in the field distribution, the inner diameter of the ring-like grounding electrode may be smaller than the inner diameter of the deflection electrode.

It is also preferable that the end portion of the electrostatic deflector on the image plane side be shifted from the end portion of the rings of magnetic material on the image plane side toward the object plane side, in the direction of the central axis.

Preferably, the electrostatic deflector may have an inner diameter substantially equal to that of the ring-like grounding electrode.

It is also preferable to provide a shielding electrode, for example, in the form of a hollow cylinder, around the outer periphery of the electrostatic deflector.

In a preferred embodiment of the present invention, there is provided a case having a first room for accommodating the coil of the magnetic lens, a second room for accommodating the rings and a third room for accommodating the electrostatic deflector and the ring-like grounding electrodes. The case may have a flange extended inwardly to cover the ring-like grounding electrode disposed on the object plane side of the electrostatic deflector. It is preferable to provide a sealing member made of non-magnetic material between the first and second rooms so that the second room is vacuum-tightly sealed and that the rings are fixed at predetermined positions.

In addition, it is preferable that the ring-like grounding electrode on the image plane side has a flange for supporting the rings.

Further, a stigmator coil can be wound on the periphery of a portion of the electrostatic deflector which is protrudes from the rings toward the object plane side. A dynamic focusing coil can be wound around the stigmator coil.

BRIEF DESCRIPTION OF THE DRAWINGS

FIG. 1A is a longitudinal sectional view schematically showing a fundamental arrangement of a deflective focusing system according to the present invention;

FIG. 1B is a cross sectional view taken along line A—A' of FIG. 1A;

FIG. 4 is a Real-Imaginary diagram illustrating the relationship between fringe position and the deflective astigmatism coefficient;

FIG. 18 is a longitudinal sectional view showing a specific embodiment of the structure of a deflective focusing system according to the present invention; and FIG. 19 is a cross sectional view showing an embodiment of an electrostatic deflector with a shielding electrode.

DETAILED DESCRIPTION OF PREFERRED EMBODIMENTS

Figure 2:
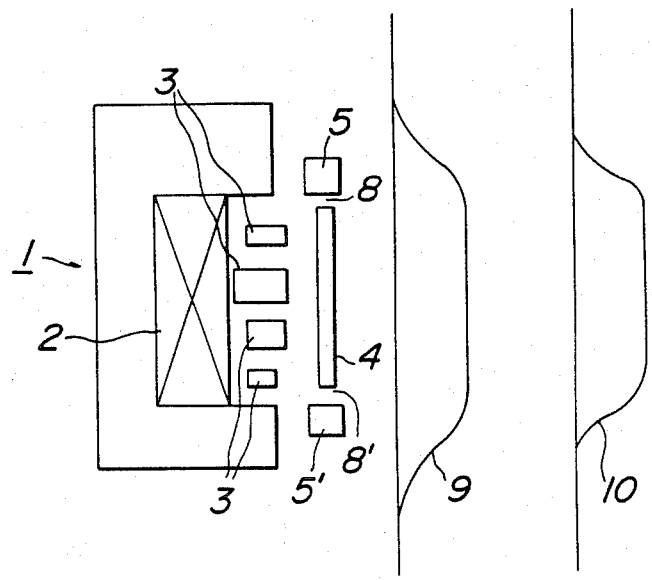
FIG. 2 is an explanatory diagram schematically illustrating a magnetic focusing field and an electrostatic deflection field in the deflective focusing system according to the present invention, placing great emphasis on the uniformity of the field distributions in the central portion.

FIGS. 1A and 1B schematically illustrate an embodiment of the structure of a deflective focusing system according to the present invention. In FIGS. 1A and 1B, reference numeral 1 denotes a magnetic lens for focusing an incident charged particle beam, 2 a focusing coil and 3 magnetic rings made of magnetic material and disposed substantially concentrically with and inside of the magnetic lens 1. These rings 3 are spaced apart and are disposed in the direction of the central axis of the magnetic lens 1. Reference numeral 4 denotes deflection electrodes of an electrostatic deflector disposed substantially concentrically with the magnetic lens 1 and inside of the rings 3, and 5 and 5' denote ring-like grounding electrodes disposed substantially concentrically with the magnetic lens 1 on the object plane side and the image plane side of the electrostatic deflector. Reference numerals 6, 6' and 6" denote spacers made of non-magnetic material for holding and supporting the rings 3 and the ring-like grounding electrodes 5 and 5', 7 denotes a cylindrical insulator for supporting the deflection electrodes 4, and 8 and 8' denote gaps provided between the electrodes 5 and 5' and the deflection electrodes 4 for adjusting the strength of the electrostatic deflection field. The deflection electrodes 4 of the electrostatic deflector are so arranged inside of the magnetic lens 1 and supported by the insulator 7 that the magnetic focusing field overlaps the electrostatic deflection field as seen in FIG. 2.

For example, the rings 3 can be formed by permalloy and have an inner diameter of about 80 mm, an outer diameter of about 120 mm, and a thickness of 5–5 mm. The rings 3 are stacked alternately with the ring-like spacers 6. It is to be noted that the deflection electrodes 4, the ring-like grounding electrodes 5 and 5' and the spacers 6, 6' and 6" are formed by non-magnetic conductor, such as phosphor bronze. The electrostatic deflector has at least four, usually eight or more, for example, 8–12, deflection electrodes 4 (for the purpose of preventing four-fold aberration) which are circumferentially arranged at spaced apart positions. Each of the deflection electrodes 4 has an elongated form such as plate, rod or cylinder having usually a length of 50–150 mm. The form may be varied in a desired manner, as long as every electrode 4 has the same shape. The respective electrodes 4 are insulatedly arranged in the form of a cage and are concentric with the magnetic lens 1. The inner diameter of the electrostatic deflector is 40 mm and the outer diameter thereof is 50–60 mm.

In this embodiment, the magnetic focusing field and the electrostatic deflective field are so determined as to have substantially uniform strengths in the central portion of the magnetic lens 1 in the following manner.

(1) The position of the rings 3 in the magnetic lens 1, the inner and outer diameters and sectional shape or the like of the rings 3 are suitable selected as parameters in a manner that the magnetic focusing field is so adjusted to have a substantially uniform strength in a predetermined interval in the central portion of the magnetic lens 1 and that fringe portions of the magnetic focusing field are ajusted.

(2) The position, the inner and outer diameters, the width and the sectional shape of the deflection electrodes 4 of the electrostatic deflector, and the position, the inner and outer diameters, the width and the sectional shape of the ring-like grounding electrodes 5 and 5' arranged on both sides of the object and image planes are suitably selected as parameters, in such a manner that the electrostatic deflection field in the electrostatic deflector, i.e., in the magnetic lens 1, has a substantially uniform strength in a predetermined interval in the central portion of the magnetic lens 1. And the position, the inner and outer diameters, the width and the sectional shape of the ring-like grounding electrodes 5 and 5' arranged on both sides of the object and image planes are especially suitably selected for controling the fringe portions of the electrostatic deflection field distribution.

In this way, the aberrations are decreased and the beam is incident vertically or with a small landing angle to the target plane by using the magnetic focusing field and the electrostatic deflection field with substantially uniform strength in a suitable interval in the central portion of the magnetic lens 1 and by adjusting the fringe portions of the electromagnetic field.

FIG. 2 schematically illustrates the magnetic focusing field distribution and the electrostatic deflection field distribution in the system according to the present invention, shown in FIG. 1. It should be noted that FIG. 2 exaggeratedly shows the uniformity of these distributions in the vicinity of the central portion of the lens forming a focusing magnetic field. Acutally, it is difficult to realize a substantially uniform magnetic focusing field and electrostatic deflection field over the whole deflective focusing space in the deflective focusing system. As shown in FIG. 2, the magnetic focusing field distribution 9 and the electrostatic deflection field distribution 10 decrease in the vicinity of both ends of the magnetic lens 1. In the present invention, however, a length of the portion where the fields are distributed substantially uniformly in the central portion of the magnetic lens 1, and the decreasing strengths of the fields in the vicinity of the both end portions of the magnetic lens 1, i.e., the fringe portions, can be easily controlled by suitably varying the above-described parameters of the magnetic lens 1 and the electrostatic deflector. As a result, the increases of the beam aberrations and the beam landing angle are suppressed.

More specifically, the inventors of the application have found the following facts after the various analyses of the aberration formulae with respect to a system where a magnetic focusing field and an electrostatic deflection field are superposed. This is, if the magnetic focusing field distribution and the electrostatic deflection field distribution are adjusted in a suitable manner by the rings 3, the deflection electrodes 4 and the ring-like grounding electrodes 5 and 5', the influences of the fringe portions upon the aberrations and the vertical landing error angle can be cancelled out by the above-mentioned adjustment with only a one-stage deflector, in a way different from the above-described prior art requiring a plurality of deflectors.

Figure 3B:
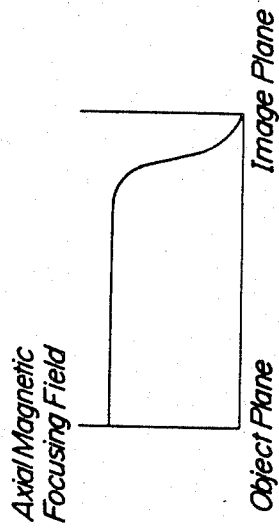
FIGS. 3A–3D are explanatory diagrams of the fringes of the magnetic focusing field and the electrostatic deflection field.
Figure 3D:
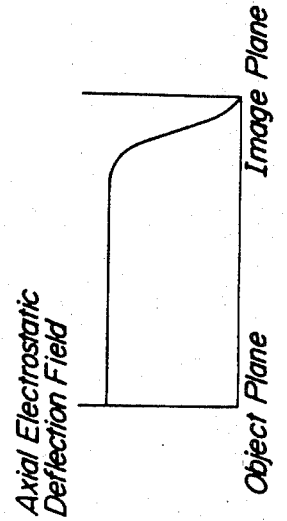
Figure 3A:
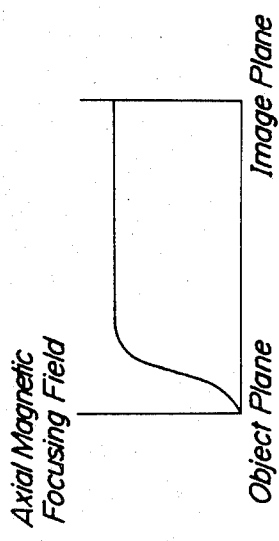
Figure 3C:
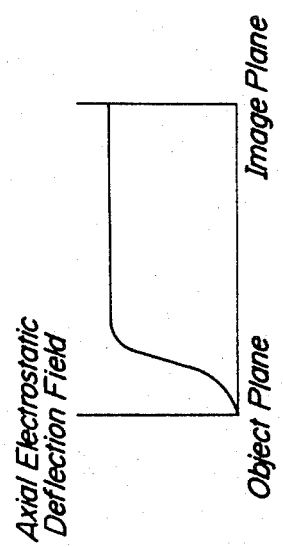

Assume now that there is only one fringe in each of the axial magnetic focusing field distribution and the axial electrostatic deflection field distribution, as illustrated in FIGS. 3A–3D, and that the fringe is simulated by a suitable form such as a sinusoidal form. In this case, the relationship between the deflective astigmatism coefficient and a fringe position is illustrated in FIG. 4. Here, it is assumed that the width of the fringe is fixed and the fringe position is taken as parameter. Further, FIGS. 3A and 3B illustrate fringes of the axial magnetic focusing field distribution on the object plane side and the image plane side, respectively. FIGS. 3C and 3D illustrate fringes of the axial electrostatic deflection field distribution on the object plane side and the image plane side, respectively.

It is further assumed that the deflective astigmatism locates at point A in FIG. 4 prior to the above-described adjustment. In this situation, the fringe (I) on the object plane side and the fringe (II) on the image plane side of the magnetic focusing field are located at the positions (I) and (II) in FIG. 5A, respectively, and these fringes (I) and (II) correspond to X points (I) and (II) in FIG. 4, respectively. Similarly, the fringe (III) on the object plane side and the fringe (IV) on the image plane side of the electrostatic deflection field are located at the positions (III) and (IV) in FIG. 5B, respectively, and these fringes (III) and (IV) correspond to X points (III) and (IV) in FIG. 4, respectively.

In a specific example, the distance between the object plane and the image plane is 200 mm, and the deflective astigmatism coefficient at point A was 0.36 μm. Further, this deflective astigmatism coefficient and other aberrations which will be shown in the following were measured at a corner of an electrostatic deflection region of 10 mm when the opening angle of the beam was 5 m rad. With respect to other major aberrations, the deflective coma length was 0.10 μm, the deflective chromatic aberration was 0.23 μm and the landing angle was 2.2 m rad/1 mm$^\square$. In this example, the deflection astigmatism is large, so that the deflection astigmatism should be reduced. For that purpose, in the present invention, the position and the width of the four fringes are adjusted in a manner that a locus of the deflection astigmatism approaches the origin O, corresponding to an ideal condition.

Figure 5A:
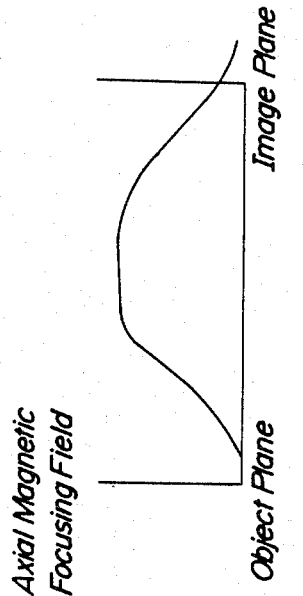
FIGS. 5A and 5B are distribution diagrams illustrating an axial magnetic focusing field distribution and an axial electrostatic deflection field distribution, prior to adjustment, respectively.
Figure 5B:
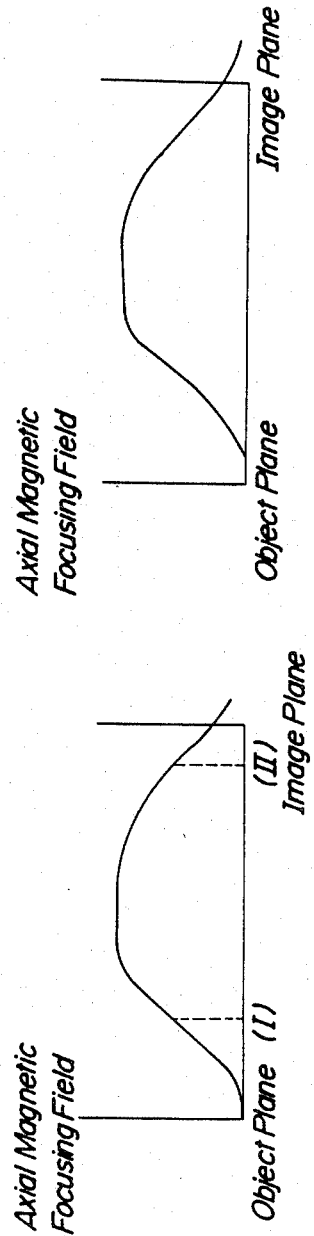
Figure 6A:
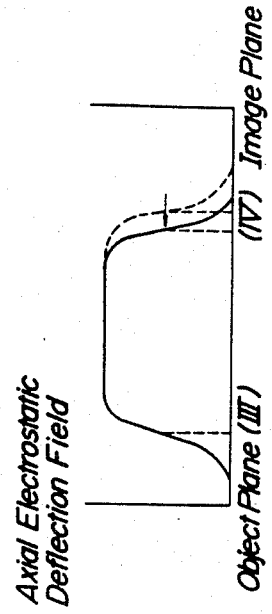
FIGS. 6A and 6B are distribution diagrams illustrating an axial magnetic focusing field distribution and an axial electrostatic deflection field distribution, after adjustment, respectively.
Figure 6B:
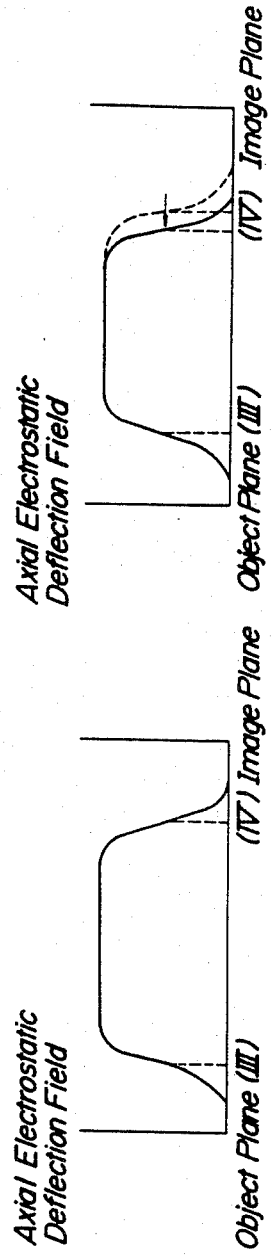
Figure 7:
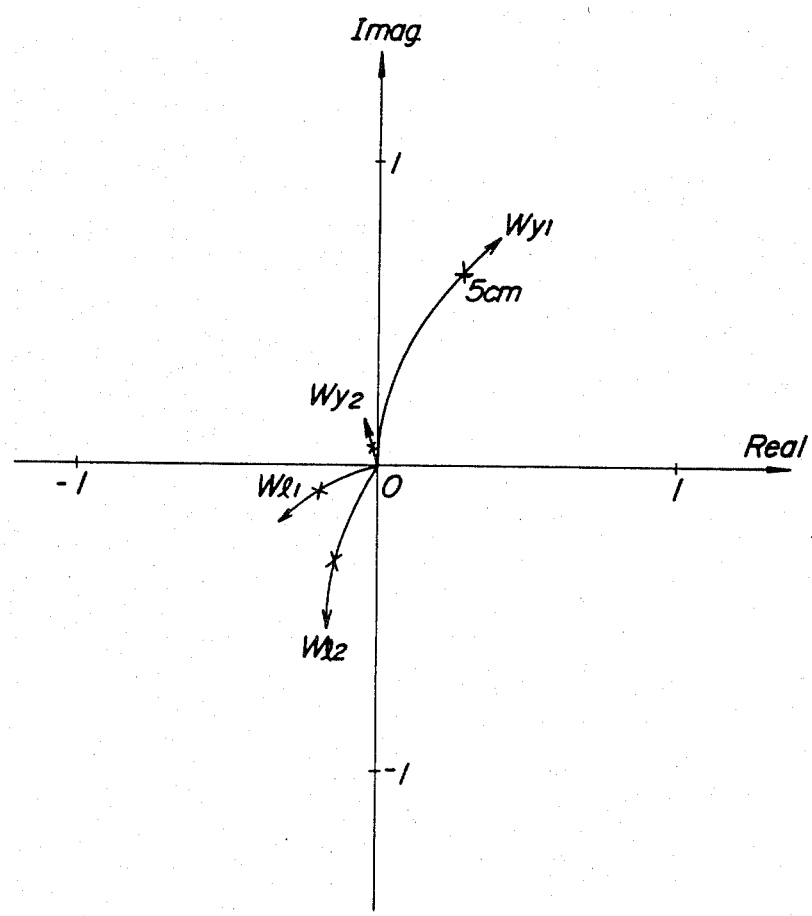
FIG. 7 is a Real-Imaginary diagram illustrating the relationship between the deflective coma length coefficient and fringe width.
Figure 8:
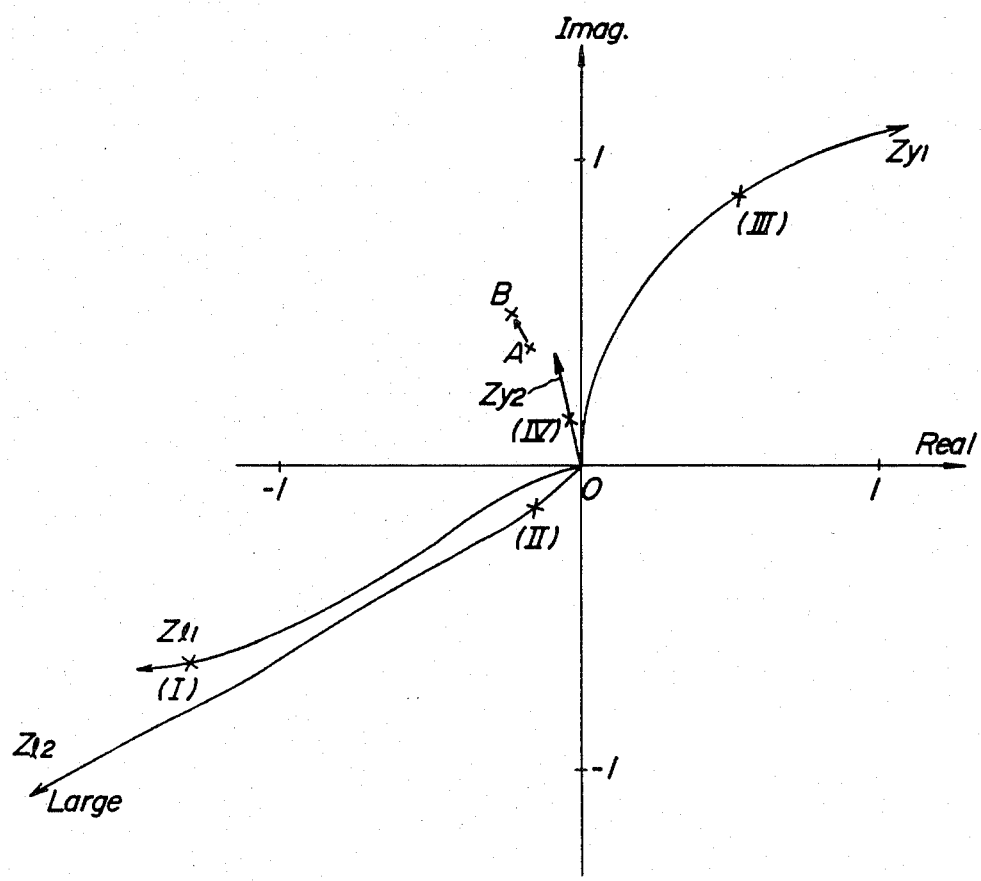
FIG. 8 is a Real-Imaginary diagram illustrating the relationship between the deflective coma length coefficient and fringe position.
Figure 9:
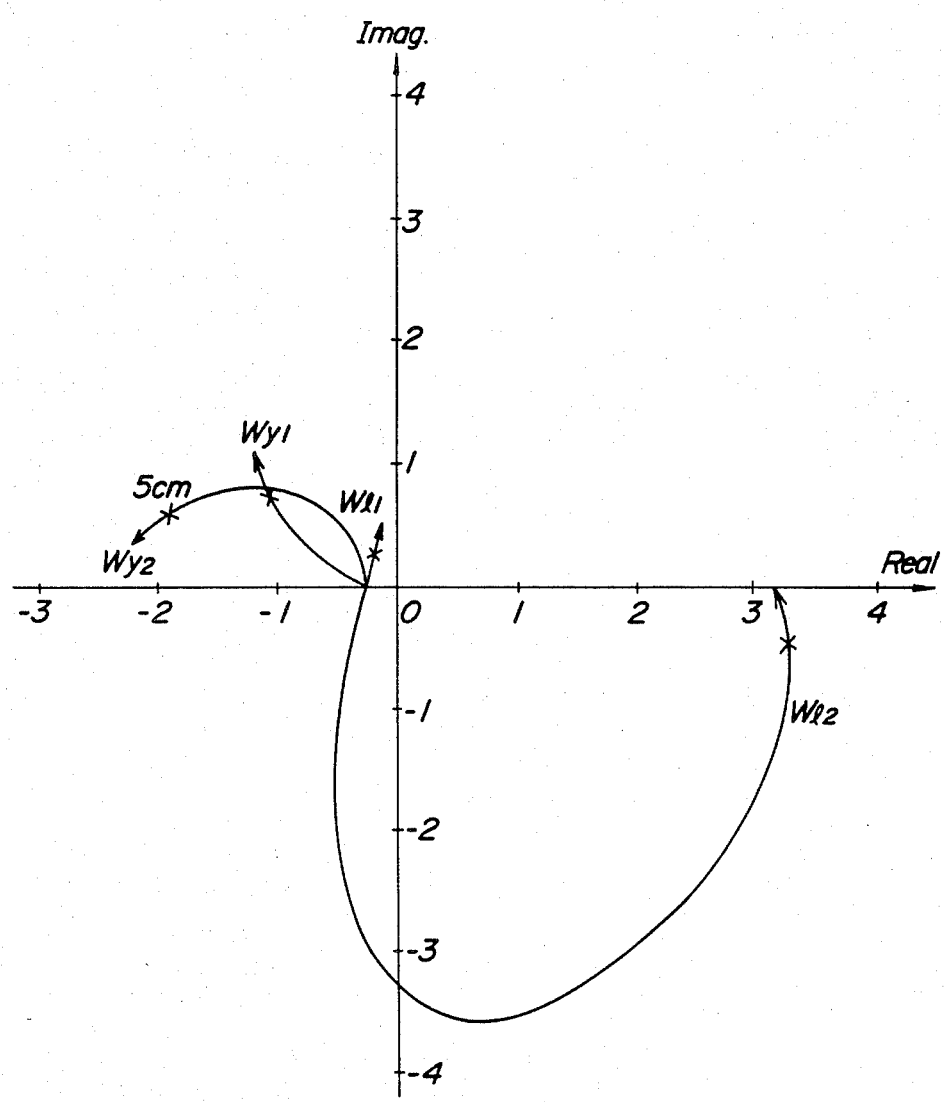
FIG. 9 is a Real-Imaginary diagram illustrating the relationship between the deflective astigmatism coefficient and fringe width.
Figure 10:
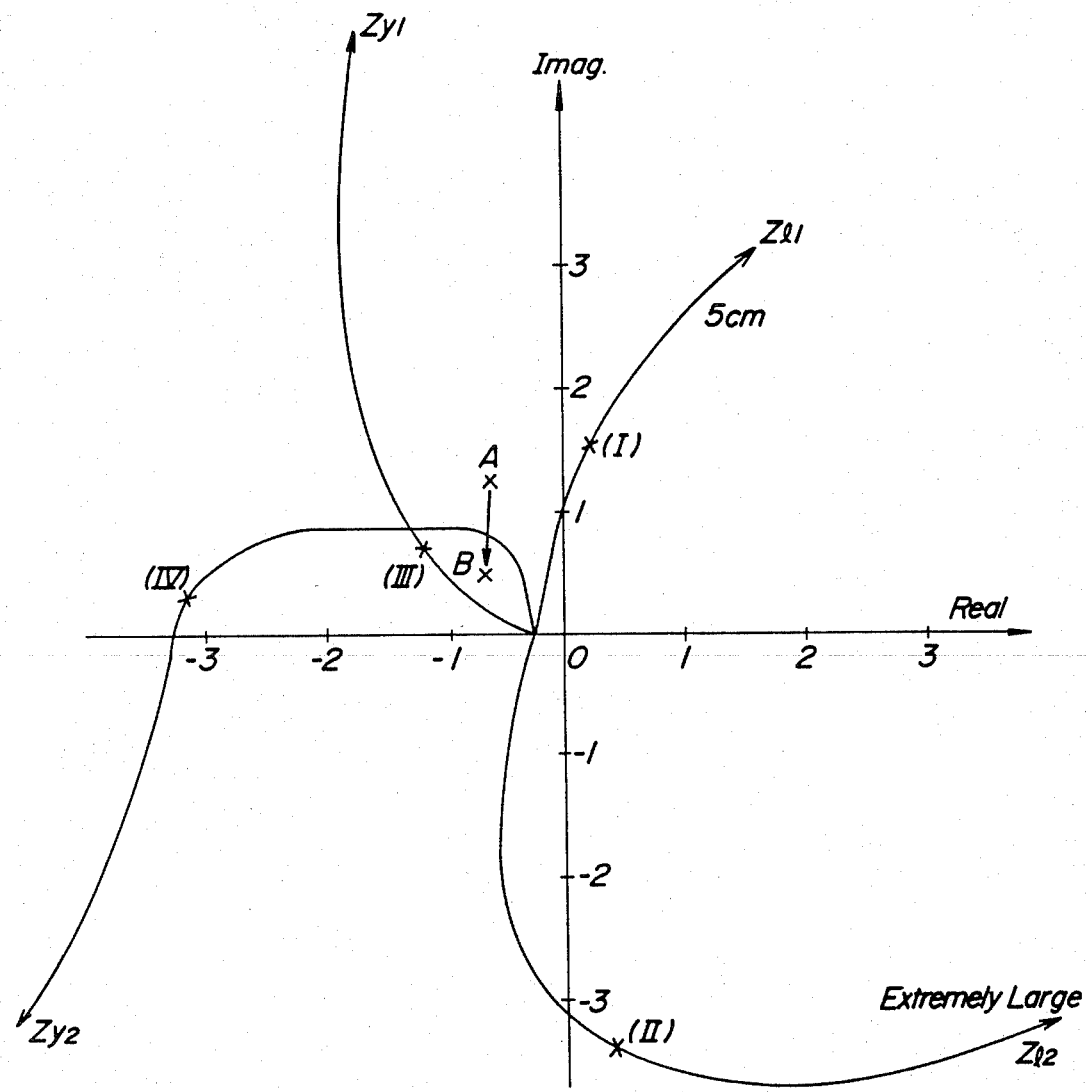
FIG. 10 is a Real-Imaginary diagram illustrating the relationship between the deflective astigmatism coefficient and fringe position.
Figure 11:
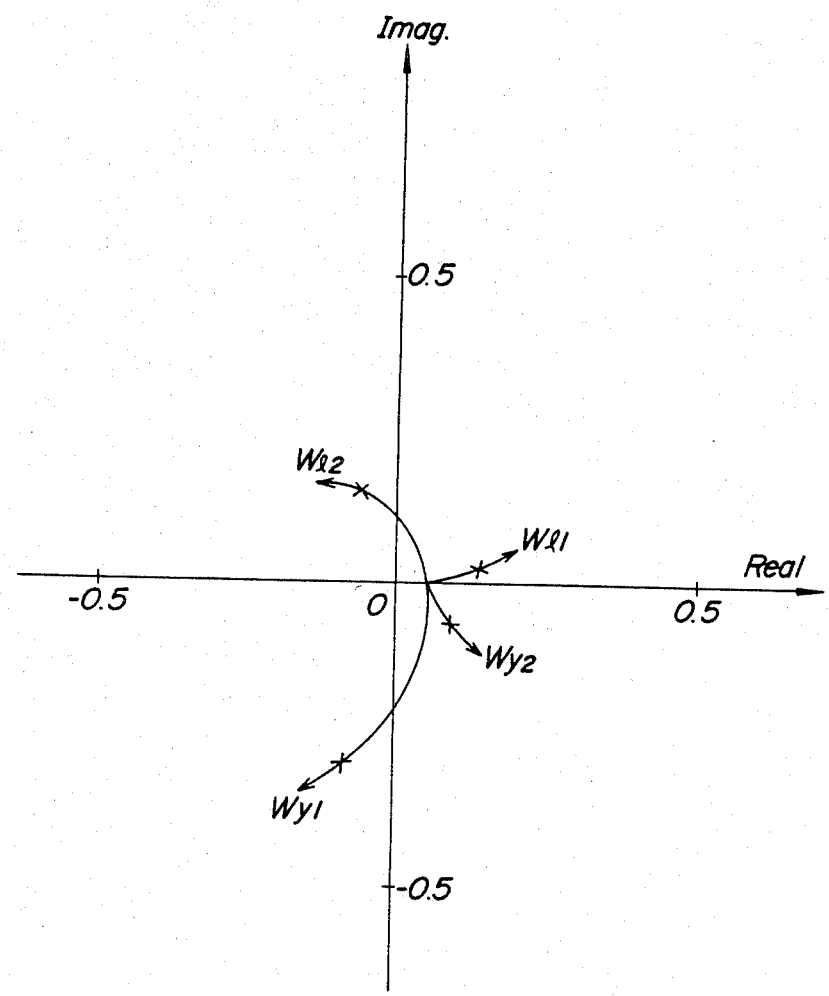
FIG. 11 is a Real-Imaginary diagram illustrating the relationship between the deflective chromatic aberration coefficient and fringe width.
Figure 12:
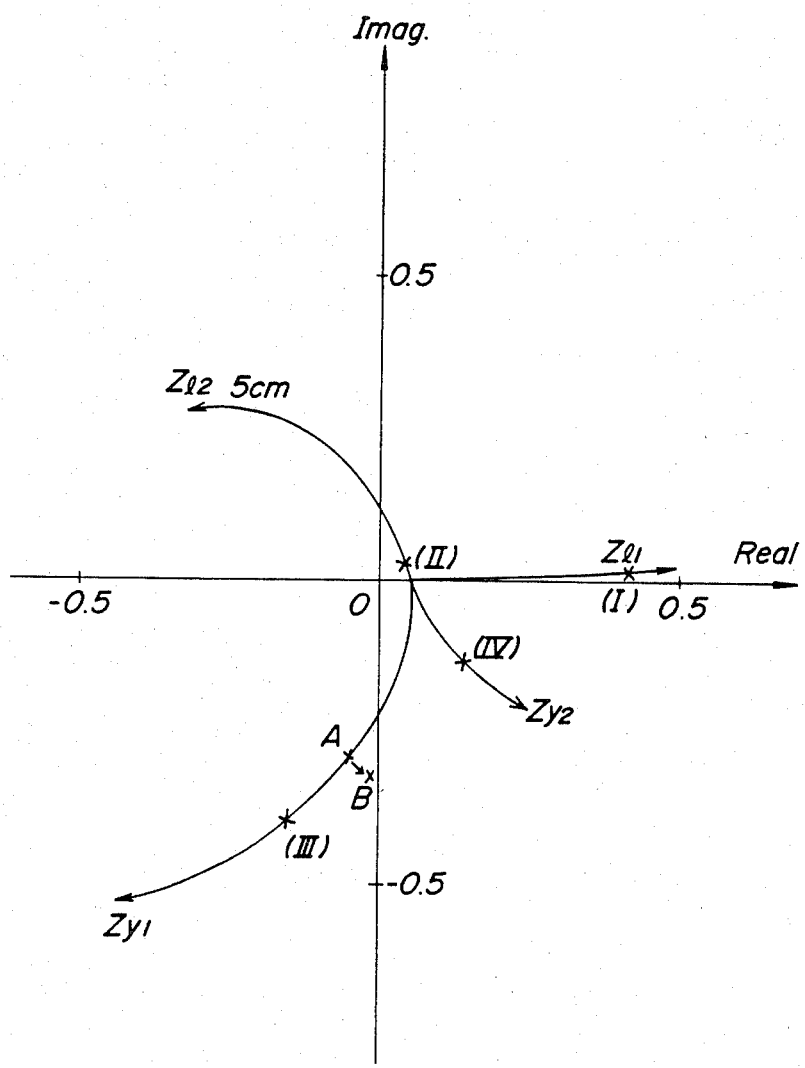
FIG. 12 is a Real-Imaginary diagram illustrating the relationship between the deflective chromatic aberration coefficient and fringe position.
Figure 13:
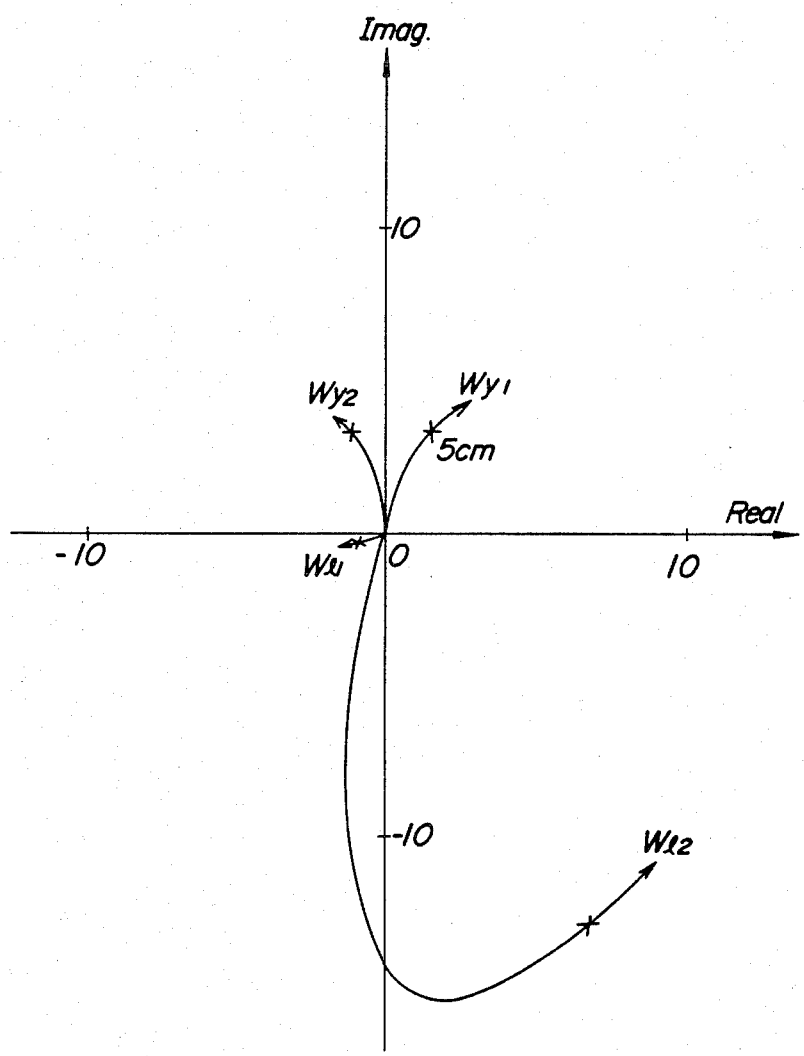
FIG. 13 is a Real-Imaginary diagram illustrating the relationship between the vertical landing error coefficient and fringe width.
Figure 14:
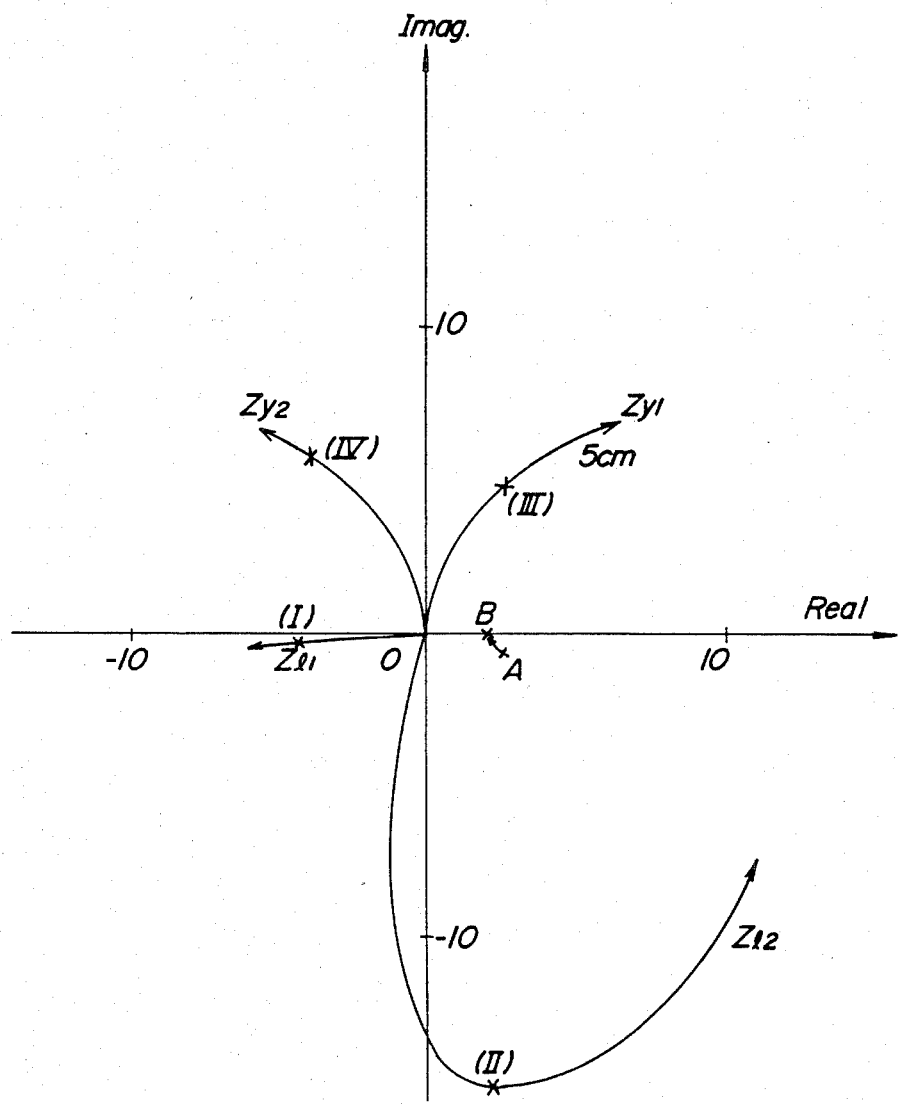
FIG. 14 is a Real-Imaginary diagram illustrating the relationship between the vertical landing error coefficient and fringe position.

If the respective fringe positions are shifted rightwards and leftwards, in FIGS. 5A and 5B, the respective fringe positions on the loci moves along the direction L or R, as illustrated in FIG. 4. For instance, if the fringe (IV) of the electrostatic deflection field on the image plane side is shifted leftwards in FIG. 5B, the corresponding X point (IV) moves along the L direction in FIG. 4. As a result, point A approaches the origin O and the deflective astigmatism decreases. For example, when the fringe was shifted by 3 mm leftwards in FIG. 5B, then point A moved to point B, so that the deflective astigmatism decreased to 0.26 μm. In this example, the deflective coma length coefficient was 0.11 μm, the deflective chromatic aberration coefficient was 0.25 μm, and the vertical landing error coefficient was 1.8 m rad/mm$^\square$. As a result, among the major aberrations, the deflective astigmatism is reduced to $\frac{2}{3}$ of that before the adjustment, while the remaining aberrations remain substantially the same as the values before adjustment.

Figure 15A:
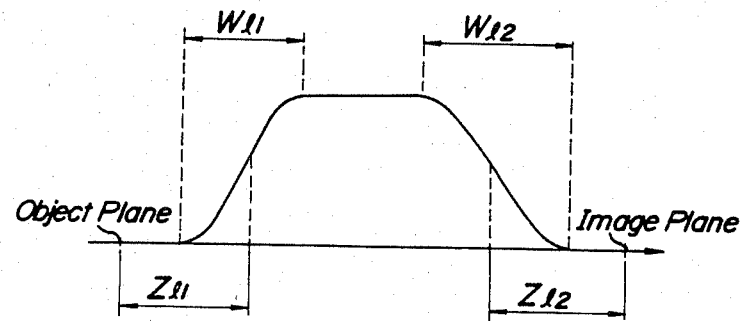
FIGS. 15A and 15B are explanatory diagrams illustrating the definitions of the fringe width and fringe position in FIGS. 7–14.
Figure 15B:
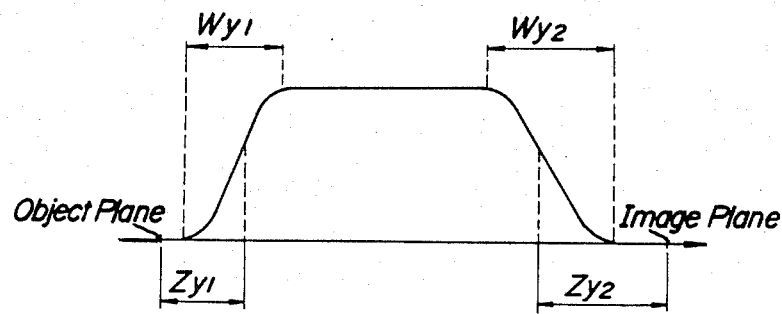

In the above, the reduction of the deflective astigmatism by adjusting the fringe positions of the magnetic focusing field distribution and the electrostatic deflection field distribution has been exemplified. In actual design, the relationships of the deflective coma length, the deflective astigmatism, the deflective chromatic aberration and the landing angle with the positions and the widths of the fringes are obtained as illustrated in FIGS. 7–14. In accordance with these relationships, the optimum positions and widths of the fringes which decrease both of the various aberrations and the landing angle are obtained. Here, the positions and widths of the fringes in FIGS. 7–14 are defined as illustrated in FIGS. 15A and 15B. Namely, in FIG. 15A, the width and the position of the fringe on the object plane side of the magnetic focusing field are $W_{l1}$ and $Z_{l1}$, respectively. The width and the position of the fringe on the image plane side of the magnetic focusing field are $W_{l2}$ and $Z_{l2}$, respectively. In FIG. 15B, the width and position of the fringe on the object plane side of the electrostatic deflection field are $W_{y1}$ and $Z_{y1}$, respectively. The width and position of the fringe on the image plane side of the electrostatic deflection field are $W_{y2}$ and $Z_{y2}$, respectively.

Figure 16A:
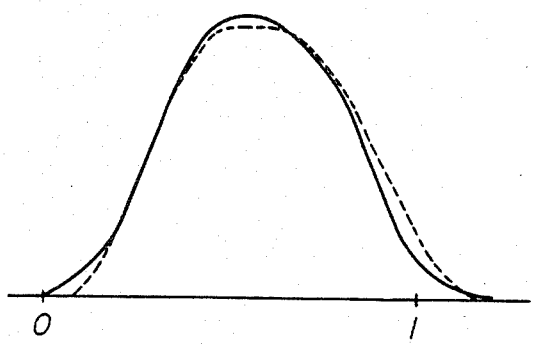
FIGS. 16A and 16B are distribution diagrams illustrating optimum and actual axial magnetic focusing field distributions and actual axial electrostatic deflection field distributions, respectively.
Figure 16B:
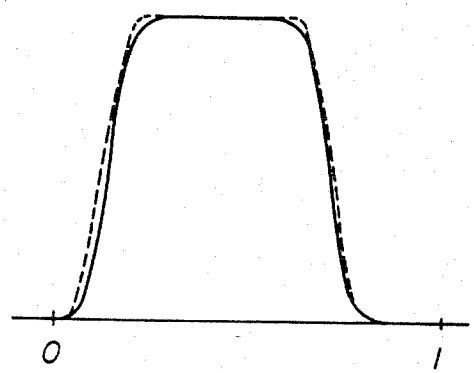

In this manner, the optimum magnetic focusing field distribution and the optimum electrostatic deflection field distribution are obtained, for example, as shown by dotted lines in FIGS. 16A and 16B, respectively. Comparing the magnetic field distribution in FIG. 16A with the electrostatic deflection field distribution in FIG. 16B, the fringe position on the object plane side O of the magnetic focusing field is coincident with that of the electrostatic deflection field. As the fringe position is shifted toward the image plane side I, the magnetic focusing field increases with a relatively slow sinusoidal waveform in the vicinity of the middle position between the object plane O and the image plane I, and the magnetic focusing field distribution has a portion having a uniform strength in a short interval in the middle portion. Then, the magnetic focusing field decreases again with a relatively slow sinusoidal waveform. Here, it should be noted that the fringe on the image plane side I of the magnetic focusing field is not zero at the position of the image plane I and that the fringe extends to a position which is a little bit outside of the image plane position I, i.e., to the position of a specimen.

On the other hand, the electrostatic deflection field rises from the object plane position with a sinusoidal waveform steeper than that in the case of the magnetic focusing field. After this steep rising the electrostatic deflection field maintain a uniform strength in a relatively long interval. Then, in the vicinity of the image plane position, the electrostatic deflection field falls with a steep sinusoidal waveform. Here, it should be noted that the electrostatic deflection field is completely zero at the position of the image plane, unlike the case of the magnetic focusing field.

Even if the electrostatic deflection field is zero in the vicinity of the image plane position B in this way, the magnetic focusing field has a finite value, so that the deviation of the charged paricle due to the electrostatic deflection field can be reduced by the magnetic focusing field up to the specimen. Consequently, the landing angle and the aberrations, especially deflective astigmatism, can be decreased. The electrostatic deflection field is distributed uniformly over a major portion, except that both fringe portions, so that the charged particle can be deflected with a large deflection amount by a small voltage. Accordingly, the sensitivety of the deflective focusing system can be enhanced.

The specific shapes and arrangements of the magnetic focusing lens and the electrostatic deflector are determined in the following manner so as to obtain an optimum electromagnetic field distribution.

With respect to the magnetic focusing lens 1, the number of the rings 3 and the widths and the distances of the respective rings 3 are adjusted successively, so that the actual magnetic focusing field distribution coincides with the optimum distribution shown in FIG. 16A. The inner diameter of the rings 3 is so determined as to accommodate the electrostatic deflector therein. The rings 3 function to mitigate asymmetricity of the magnetic field caused by the ununiformity of the winding of the focusing coil 2.

With respect to the electrostatic deflector, the longitudinal length of the deflection electrodes 4 and the distances between the deflection electrodes 4 and the ring-like grounding electrodes 5 and 5' are successively adjusted, so that the actual electrostatic deflection field distribution coincides with the optimum distribution shown in FIG. 16B. The unifomity of the electrostatic deflection field is mainly achieved by the one-stage electrostatic deflector 4. Both fringes of the electrostatic deflection field are mainly formed by the ring-like grounding electrodes 5 and 5'. Further, it is possible to obtain the electrostatic deflection field distribution illustrated in FIG. 16B only by the electrostatic deflector without the provision of the ring-like grounding electrodes 5 and 5'.

In order to improve manufacturing accuracy, the deflection electrodes 4 of the electrostatic deflector and the ring-like grounding electrodes 5 and 5' may have the same inner diameters.

Figure 17:
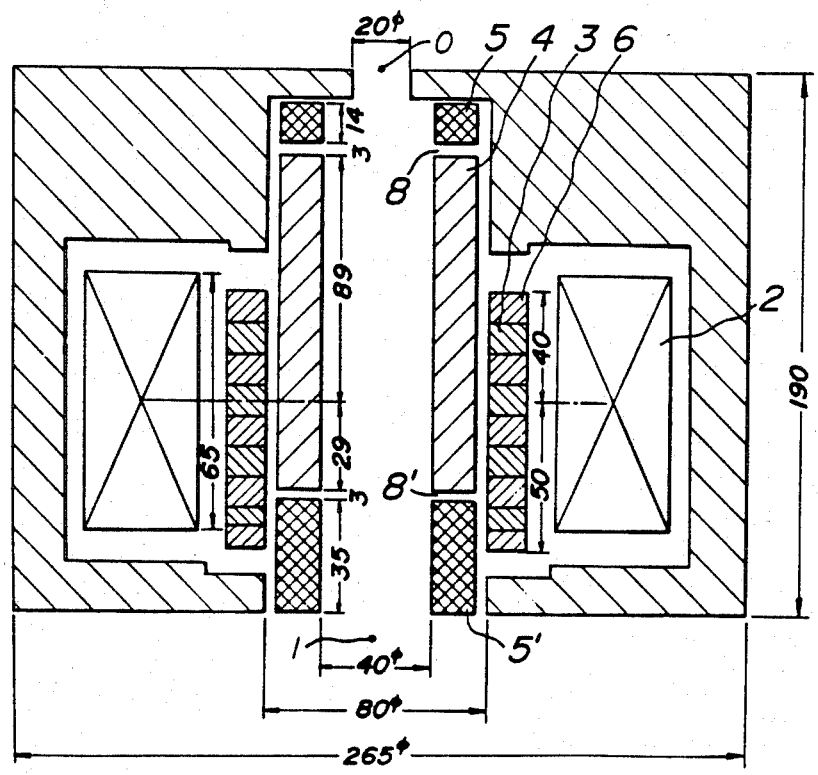
FIG. 17 is a longitudinal sectional view showing an embodiment of the structure of a deflection focusing system according to the present invention with an example of dimensions of various portions.

An embodiment of a deflective focusing system according to the present invention which was formed in this manner is shown in FIG. 17 with an example of dimensions of various portions in the system. These dimensions are indicated in millimeters. Further, the values of these dimensions may be modified as long as the dimensions increase or decrease in proportion. According to this deflective focusing system the magnetic field distribution and the electrostatic deflection field distribution were obtained as shown by the solid lines in FIGS. 16A and 16B, respectively. Further, in this embodiment, the deflection electrodes 4 are shifted from the end portion of the ring 3 on the image plane side toward the object plane side in the direction of the central axis of the magnetic coil 2. The deflection electrodes 4 have the same inner diameter as those of the ring-like grounding electrodes 5 and 5'.

Next, a specific embodiment of a deflective focusing system according to the present invention is shown in FIG. 18. In FIG. 18, the same reference numerals as in FIGS. 1A and 1B are used to indicate like portions. In FIG. 18, reference numerals 11 and 12 denote upper and lower cases made of magnetic material. These cases form a room accommodating the focusing coil 2. These cases 11 and 12 are connected tightly by a screw 13. The focusing coil 2 is mounted on a ring-like spacer 14 which is disposed on a bottom surface of the lower case 12. In addition, the cases 11 and 12 form two other rooms for accommodating the rings 3 formed, for example, by permalloy and a room for accommodating the deflection electrodes 4 of the electrostatic deflector and the grounding electrodes 5 and 5'. Around the inner circumferential surface of the focusing coil 2, a sealing member 15 in the form of a hollow cylinder made of non-magnetic material is disposed to vacuum-tightly seal the inside of the sealing member 15. The sealing member 15 also aligns the rings 3 and the spacer 6 formed, for example, by phosphor bronze. The sealing member 15 is air-tightly attached to the cases 11 and 12 by O-rings 16 and 17. A connector 19 is attached to the sealing member 15, the connector 19 being connected to the deflection electrodes 4 through a connecting pin 18. Connector pins 22 are also attached to the sealing member 15'. Connector pins 22 are connected to a stigmator formed by winding a coil 21 around a stigmator coil bobbin 20. These connector pins 22 are further connected to a connector 23 attached to the cases 11 and 12. Reference numeral 24 denotes a dynamic focusing coil arranged around the stigmator. A connector 25 for supplying an electric current to the magnetic focusing coil 2 is also attached to the case 12. A shielding electrode 26 in the form of a hollow cylinder surrounds the outer periphery of the insulator 7.

While the ring-like grounding electrode 5' on the image plane side may have the same configuration as that of the ring-like grounding electrode 5 on the object plane side, as shown in FIG. 1A, in this embodiment, the grounding electrode 5' has a flange 5A' as a spacer for supporting the electrostatic deflector, and has an annular portion extended in the axial direction longer than the grounding electrode 5 on the object plane side. There is provided an opening 5B' for evacuating the inside of the grounding electrode 5' in the annular wall. The upper end portion of the upper case 11 has a flange 11A for covering the ring-like grounding electrode 5 on the object plane side, so that the magnetic field produced in the system does not exert influence upon a pre-stage (object plane side). Further, in connection with the arrangement wherein the electrostatic deflector, having the deflection electrodes 4, is shifted toward the object plane side with respect to the combination of the rings 3 and the spacers 6, the thickness of the upper surface portion 11B of the upper case 11 is made greater than the thickness of the lower surface portion 12A of the lower case 12.

In FIG. 18, reference numeral 31 denotes a specimen table for placing a standard specimen to be used to confirm the shape of the beam section on the object surface of the deflective forcusing system. Reference numeral 32 denotes a detector for detecting electrons reflected from the specimen table 31, 33 a specimen table for wafer, and 34 a detector for detecting a beam condition on the specimen table 33.

FIG. 19 shows a cross sectional view of the electrostatic deflector having the deflection electrodes 4 in FIG. 18, as seen from the object plane side. As seen in FIG. 19, the insulator 7 comprises strips attached to the deflection electrodes 4. A plurality of combinations of an electrode 4 and an insulating strip 7 are disposed circumferentially at spaced apart position on the inner surface of the cylindrical shielding electrode 26. The shielding electrode 26 is maintained at an equipotential, such as ground potential. The shielding electrode 26 may be formed by phosphor bronze. Further, as shown in FIG. 18, the shielding electrode 26 has an opening 26A in which an insulator 26B having a hole 26C is inserted. The connecting pin 18 is inserted tightly into the hole 26C, so that the pin 18 is connected electrically to the deflection electrodes 4.

In FIG. 19, the deflection electrodes 4 and the insulating strips 7 are laminated in an overlapped manner in such a way that the insulating strips 7 are not seen between the separated deflection electrodes 4, but the shielding electrode 26 is seen between these deflection electrodes 4, when the deflection electrodes 4 are seen from the center of the electrostatic deflector. According to this structure, the insulating strips 7 are prevented from being charged up and the influences of outer electrostatic fields upon the deflective focusing system is prevented by the shielding electrode 26. Thus, the controllability of the electrostatic deflector is improved.

When a deflective focusing system according to the invention is manufactured, various manufacturing allowances should be considered. Such allowances can be estimated by evaluating an increase of total aberration due to the manufacturing errors. Table 1 shows the allowances calculated under the condition that the total aberration is 0.2 μm or less. Further, among the manufacturing errors, the following four types are important, when obtaining the allowances.

TABLE 1

| Type of error | Allowance |
| --- | --- |
| deviation of the electrostatic deflector in the direction of the central axis | 1 mm or less |
| deviation of the angle by which the deflection electrodes 4 are separated | 0.03° or less |
| inconsistency between the central axes of the magnetic lens and | 100 μm or less |

TABLE 1-continued

| Type of error | Allowance |
| --- | --- |
| the electrostatic deflector inclination of the central axis of the electrostatic electrostatic with respect to the central axis of the magnetic lens | 0.06° or less |

As is clear from the above explanation, according to the present invention, the fringe portions of the magnetic focusing field of the magnetic lens and the fringe portions of the electrostatic deflection field of the electrostatic deflector are adjusted by a simple arrangement having a one-stage electrostatic deflector to obtain aberrations and a landing angle as small as those in the case of a uniform electromagnetic field distribution. Since only a one-stage electrostatic deflector is sufficient to adjust the fringe portions, only one set of power sources for the deflective focusing system is required and accordingly only a small number of A/D converters with a high speed and a high accuracy and amplifers for driving the deflector are required. This results in a reduction of the total cost of a deflective focusing system according to the invention. In addition, a deflective focusing system according to the invention has a high deflection speed, since the deflector is of an electrostatic type.

What is claimed is:

1. A deflective focusing system for a charged particle beam comprising:
   a magnetic lens for focusing a charged particle beam;
   a plurality of rings made of magnetic material arranged substantially concentric with said magnetic lens inside of said magnetic lens, said rings being arranged dividedly in the direction of the central axis of said magnetic lens so as to form a predetermined magnetic focusing field distribution; and
   a one-stage electrostatic deflector having a plurality of deflection electrodes which are divided in a circumferential direction of said magnetic lens, are arranged substatially concentric with said magnetic lens inside of said magnetic lens and are extended in the direction of said central axis so as to form a predetermined electrostatic deflection field distribution, the charged particle beam passing through said concentrically arranged deflection electrodes to be deflected in accordance with a voltage applied to said deflection electrodes.

2. A deflective focusing system for a charged particle beam as claimed in claim 1, further comprising ring-like grounding electrodes which are disposed substantially concentric with said magnetic lens on the object and image plane sides of said electrostatic deflector along the passage of said charged particle beam.

3. A deflective focusing system for a charged particle beam as claimed in claim 2, wherein ring-like spacers made of non-magnetic material and having substantially the same diameter as said ring are inserted between said rings, so that the magnetic focusing field distribution is adjusted by the thicknesses of said rings in the direction of said central axis and the thicknesses of said ring-like spacers.

4. A deflective focusing system for a charged particle beam as claimed in claim 2 or 3, wherein a gap for adjusting the electrostatic deflection field is provided between said ring-like grounding electrodes and said electrostatic deflector, so that said electrostatic deflection field distribution is adjusted in accordance with the length of said gap.

5. A deflective focusing system for a charged particle beam as claimed in claim 4, wherein the inner diameter of said ring-like grounding electrode is more reduced than the inner diameter of said deflection electrode to have an abrupt fringe in the field distribution.

6. A deflective focusing system for a charged particle beam as claimed in claim 4, wherein said electrostatic deflector has the end portion on said image plane side shifted from the end portion of said ring on said image plane side toward said object plane side in the direction of said central axis.

7. A deflective focusing system for a charged particle beam as claimed in claim 2, wherein said electrostatic deflector has the inner diameter substantially equal to that of said ring-like grounding electrode.

8. A deflective focusing system for a charged particle beam as claimed in claim 7, further comprising a case having a first room, which is formed by said case and a sealing member made of nonmagnetic material, for accommodating the coil of said magnetic lens, a second room, which is formed by said sealing member, said electrostatic deflector and said grounding electrodes, for accommodating said rings, and a third room whose boundary is defined by said electrostatic deflector and said grounding electrodes and through which said charged particle beam passes, said sealing member sealing said second room vacuum-tightly and fixing said rings at predetermined positions.

9. A deflective focusing system for a charged particle beam as claimed in claim 8, wherein said case has a flange extended inwardly to cover said ring-like grounding electrode disposed on said object plane side of said electrostatic deflector.

10. A deflective focusing system for a charged particle beam as claimed in claim 2, wherein said ring-like grounding electrode on said image plane side has a flange for supporting said electrostatic deflector.

11. A deflective focusing system for a charged particle beam as claimed in claim 6, wherein a stigmator coil is wound on the periphery of a portion of said electrostatic deflector which is protruded from said rings toward said object plane side.

12. A deflective focusing system for a charged particle beam as claimed in claim 11, wherein a dynamic focusing coil is wound around said stigmator coil.

13. A deflective focusing system for a charged particle beam as claimed in claim 1 or 2, further comprising a shielding electrode around the outer periphery of said electrostatic deflector.

14. A deflective focusing system for a charged particle beam as claimed in claim 2, wherein said electrostatic deflector has the end portion on said image plane side shifted from the end portion of said ring on said image plane side toward said object plane side in the direction of said central axis.

15. A deflective focusing system for a charged particle beam as claimed in claim 14, wherein a stigmator coil is wound on the periphery of a portion of said electrostatic deflector which is protruded from said rings toward said object plane side.

16. A deflective focusing system for a charged particle beam as claimed in claim 15, wherein a dynamic focusing coil is wound around said stigmator coil.

* * * * *